United States Patent [19]

Berlekamp

[11] Patent Number: 4,916,702
[45] Date of Patent: Apr. 10, 1990

[54] ELONGATED BURST TRAPPING

[75] Inventor: Elwyn R. Berlekamp, Piedmont, Calif.

[73] Assignee: Cyclotomics, Inc., Berkeley, Calif.

[21] Appl. No.: 207,811

[22] Filed: Jun. 17, 1988

[51] Int. Cl.⁴ .......................................... G06F 11/10
[52] U.S. Cl. ................................................. 371/39.1
[58] Field of Search ..................... 371/37, 38, 39, 40, 371/39.1

[56] References Cited

U.S. PATENT DOCUMENTS

| | | | |
|---|---|---|---|
| 4,414,667 | 11/1983 | Bennett | 371/37 |
| 4,566,105 | 1/1986 | Oisel et al. | 371/37 |
| 4,584,686 | 4/1986 | Fritze | 371/37 |
| 4,592,054 | 5/1986 | Namekawa et al. | 371/39 |
| 4,698,813 | 10/1987 | Erdel | 371/40 |
| 4,782,490 | 11/1988 | Tenengolts | 371/40 |
| 4,821,268 | 4/1989 | Berlekamp | 371/37 |

Primary Examiner—Charles E. Atkinson
Attorney, Agent, or Firm—Robert M. Wallace

[57] ABSTRACT

In an error trapping decoder in which a received codeword is shifted through a re-encoder shift register to produce a set of r syndrome characters and in which the encoder shift register is then isolated and its contents shifted until a number of consecutive zero virtual check characters is produced therein, the capacity to trap long error bursts is enhanced by increasing the size of the code and by demanding that the minimum number of consecutive zero virtual check characters be only sufficient to ensure an acceptably low probability that one or more of the zero-value virtual check characters is a false indication. Such a decoder may be used to determine the location of an error burst in a received block of interleaved codewords as long as at least one of the codewords in the block produces the minimum number of consecutive zero-value virtual check characters after a requisite number of shifts of the encoder. Upon this occurrence, the codeword locations of the non-zero-value virtual check characters are designated as erasure locations for the rest of the codewords in the block, thus enabling all of them to be decoded.

10 Claims, 7 Drawing Sheets

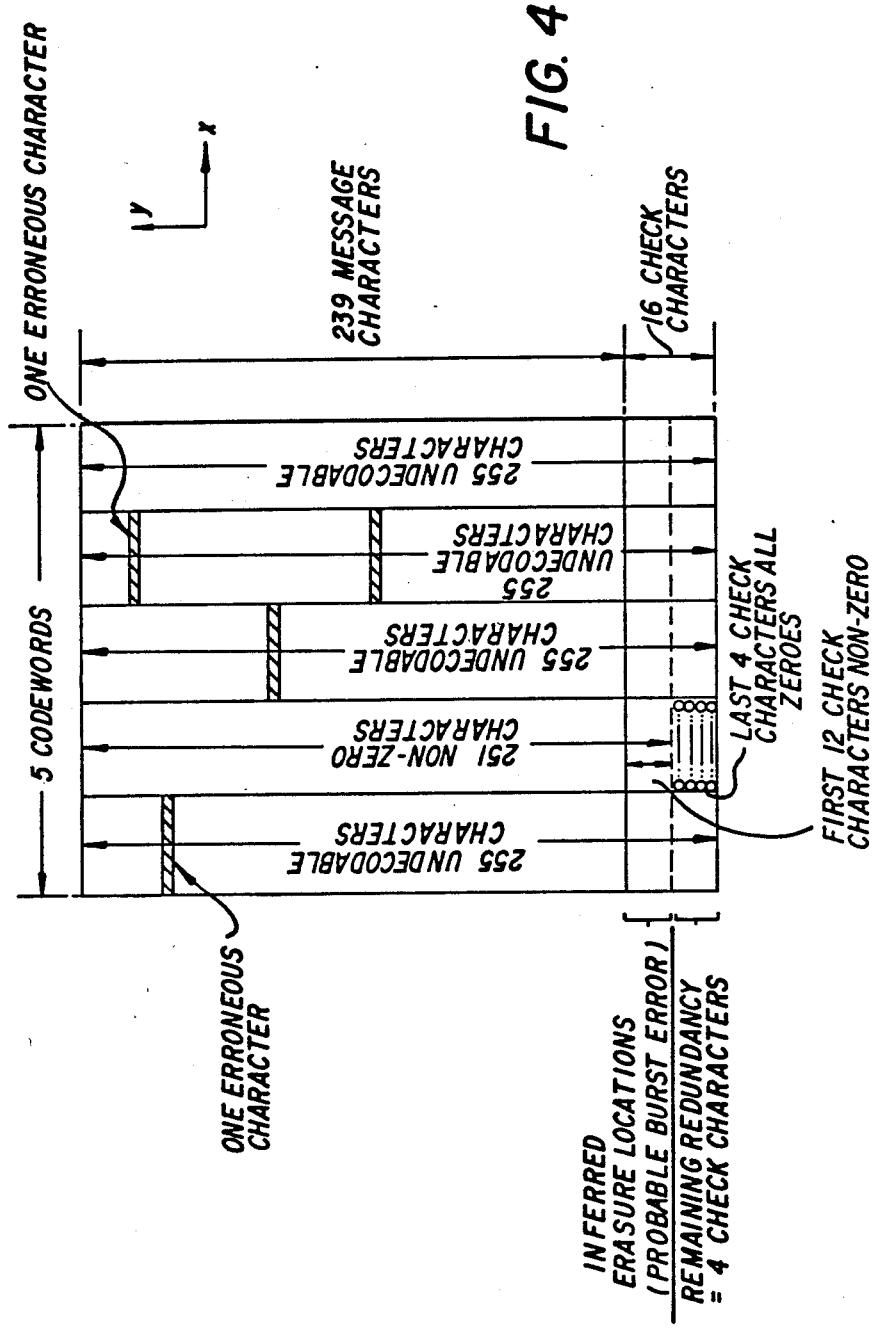

TO FIG. 5b

ELONGATED BURST TRAPPING

BACKGROUND OF THE INVENTION

Error trapping is a well-known technique in the art of error detection and correction. It is described, for example, in Peterson and Weldon, *Error-Correcting Code*, The MIT Press, 1984, at pages 237-240 and 364-367. Whenever applicable, error trapping obviates the need for the decoder to execute a highly sophisticated error correction algorithm, such as the Berlekamp key equation solver algorithm, as described in Berlekamp, *Algebraic Coding Theory*, McGraw-Hill, 1968, page 184, or the Welch-Berlekamp algorithm, which is the subject of U.S. Pat. No. 4,663,470 by Berlekamp and Welch, or the Euclidian algorithm. Avoiding the execution of such algorithms represents a significant savings in time and overhead.

The idea behind error trapping is this. Whenever a received codeword is such that all of its message symbols are correct and errors only appear in a few of the check symbols, shifting the entire received codeword through an encoder produces a set of new check symbols (or, more accurately, remainder symbols) which are all zero except those corresponding to received codeword check symbols having errors. (The term "new check symbols" as used herein is really a misnomer, since the symbols thus generated are actually "remainder" symbols defining the remainder left after dividing the entire received codeword by the code generator polynomial. The term "check symbol" usually connotes the remainder left after dividing only the message portion of the codeword by the code generator polynomial.) The new check symbols are precisely equal to the error pattern. Thus, error correction is trivially achieved by simply adding the non-zero new check symbols to the corresponding locations in the received codeword.

In order to trap errors occurring in the message portion of the received codeword, the encoder (typically a shift register having a number of feedback stages precisely equal to the number of check symbols in each codeword) is simply shifted until its contents are all zero except for a non-zero symbol pattern of no more than half ($r/2$) the total number ($r$) of check symbols. This non-zero symbol pattern is, by definition, the error pattern occurring in the corresponding shifted codeword locations. If the erroneous symbol occurs in the check portion of the received codeword, no shifting of the encoder register is necessary. If an error occurs in the last message symbol adjacent the check symbols, the encoder need be shifted only once. If the error occurs in the very first message location in the codeword, then the encoder must be shifted a number of times equal to the number of message symbols in the codeword, in order to trap the error.

PROBLEM TO BE SOLVED BY THE INVENTION

The obvious limitation of error trapping is that the length of a continuous string ("burst") of errors cannot exceed $r/2$ symbols if error correction is to be assured. Moreover, since all plural errors in a received codeword must be "trapped" in the re-encoder simultaneously, a continuous or discontinuous plural error pattern cannot exceed the length of the encoder shift register (this length is the number $r$ of check symbols in the codeword). Otherwise, error correction cannot be assured. Unfortunately, it cannot be guaranteed that all patterns of plural errors will not exceed this length. The problem is how to use error trapping to correct continuous error bursts of length greater than $r/2$ symbols.

SUMMARY OF THE INVENTION

Conceptual Basis of the Invention

To begin with, the invention involves first stepping back and looking at the reasons why error correction using the error trapping technique is restricted in the prior art to those cases in which an error burst does not exceed $r/2$ symbols in length. The reason is that, while one might eventually produce a string of less than $r/2$ zero-value symbols in the encoder shift register after an appropriate number of shifts thereof, some of the zero-valued symbols in such a case could actually be false indications of error-free symbols in the corresponding locations in the received codeword. Upon such an occurrence, the non-zero value symbols in the encoder shift register do not accurately represent the error pattern in the received codeword, and therefore do not provide complete error correction, if used in accordance with the error trapping technique described above. This is the basic reason why error trapping has been confined in the prior art only to those cases in which error bursts are less than $r/2$ symbols in length.

The next step in the invention is to recognize that the probability of such an occurrence is proportional to $n+1^{-(B-1)}$, where $n$ is the number of symbols in the code and $B$ is the number of zero-valued symbols contained in the encoder shift register after an optimum number of shifts thereof in accordance with the error trapping technique described above, with the proviso that $B$ is less than $r/2$ (where $r$ is the number of check symbols per codeword, as described above). Of course, if $B$ is equal to or greater than $r/2$, then the probability of such an occurrence is zero.

A further step in the invention is to recognize that the error trapping technique may be useful even though the foregoing probability is not precisely equal to zero, as long as it is an acceptably small number, such as $2^{-24}$, for example.

Armed with the foregoing insights, the invention proceeds as follows. First, the invention employs only a code having a relatively large number of symbols. One example is a Reed-Solomon code having 255 symbols, in which the last 16 symbols in each codeword comprise the check symbols, and in which each symbol is an eight-bit byte or "character". (The term "character" will now be employed throughout the rest of this specification.) Then, before performing error trapping, the invention requires the user to specify some acceptable upper bound on the probability of generating a false zero-value character in the encoder shift register. If one chooses an upper bound of $2^{-24}$ for this probability, then, using the exemplary Reed-Solomon 255 code, $B=4$. Thus, one simply demands that the encoder shift register be shifted in accordance with the error trapping technique described hereinabove until a continuous string of at least four zero-value characters are produced in the encoder shift register.

As long as four zero-valued characters can be generated in the encoder shift register (after an optimum number of shifts thereof), the probability of a false indication is given by: $P=(n+1)^{-(B-1)}=256^{-(4-1)}=2^{-24}$, which satisfies the upper bound chosen by the user.

For many applications, a residual bit error rate at the error correction decoder output of $2^{-24}$ is perfectly acceptable. In the general case, the probability of a false indication is negligible as long as the chosen code length is sufficiently long, even though the minimum required number of consecutive zero value characters to be produced in the encoder shift register (after an optimum number of shifts) is far below the minimum required in the prior art (i.e. r/2 characters in length).

In the foregoing example, error trapping performed in accordance with the invention can correct burst errors half again as long as the maximum correctable burst error length in the prior art, a significant improvement previously not considered possible.

Correction of Error Patterns In Interleaved Codes

The most dramatic advantage of the invention is realized in interleaved codes. In interleaved codes, as is well-known, after the user message is divided into blocks and each block is encoded into a codeword, groups of codewords are interleaved together prior to transmission, so that the characters in each codeword are not transmitted consecutively. Each group of codewords is treated as a block, and the depth of interleaving, D, is the number of codewords per block.

As an example, consider the case in which a block of codewords is received in which only one of the codewords in the block can be decoded using the error trapping technique of the invention. In such a case, none of the other codewords in the block would produce a string of zero-value characters in the encoder shift register even after the maximum number (n) shifts of the encoder shift register, while the one codeword in the block would produce at least the minimum number (for example, four) of consecutive zero-value characters in the encoder shift register after a certain number of shifts of the encoder shift register, in accordance with the error trapping technique discussed above.

In accordance with the features of the invention described thus far, it is immediately apparent that at least the one codeword is immediately correctable using the error trapping techniques of the present invention: One simply adds all of the non-zero-value characters in the encoder shift register to the symbols in the received codeword located in the corresponding positions therein. The question is, what one can do with the remaining "undecodable" codewords in the block?

The answer is to designate, for the "undecodable" remaining codewords in the block, the locations of the non-zero-value characters produced in the shift register (from the one correctable codeword) as erasure locations for all of the remaining "undecodable" codewords in the block. These erasure locations are transmitted to a conventional error decoder (which may use the Welch-Berlekamp algorithm, for example, mentioned on page 1 of the specification, or any other suitable algorithm well-known in the art). Such a decoder then proceeds to decode (correct) each of the remaining "undecodable" codewords one at a time, taking into account the erasure locations deduced in the manner just described. As long as the erasure locations do not correspond to an error burst of length greater than r symbols, a decoding algorithm such as that described in page 231 of the Berlekamp text referred to on page 1 of the specification will correct all errors in each of the remaining "undecodable" codewords in the block. Thus, the invention untangles the entire pattern of errors in the received interleaved block of codewords which, previously, would have been undecodable using prior art techniques.

The principle applicable here is the recognition that the string of non-zero-value characters, obtained by shifting the one "decodable" codeword through the encoder shift register, corresponds to the location of an error burst which cuts across *all* codewords in the interleaved block through the same codeword locations. Thus, as long as there is at least one "decodable" codeword in the block, i.e. one codeword having an error burst of length no greater than 12 (in the example of the Reed-Solomon 255 code described above) the error trapping technique of the invention may be used to correct not only the one "decodable" codeword in the block, but to identify the burst error locations for the entire block. The error burst locations thus deduced and transmitted as erasure locations to the decoder, enable the decoder to correct as many as r errors, or twice as many errors as in the case where the error locations are a priori unknown, as described in the Berlekamp text (referred to above) at page 231.

Typically, one chooses a code in which the number of check characters, r, exceeds the longest anticipated burst error length divided by D, the number of codewords per block. In this case, one can correct the remaining "undecodable" codewords in the block in accordance with the invention even though the remaining "undecodable" codewords contain not only a burst error in the locations thus deduced but one or two errors in other "random" locations. This is because the decoder may correct s erasures and t errors as long as s+2t is less than or equal to r. For example, if r is equal to 16 check characters and if the error burst length (number of erasures) s deduced from the one "decodable" codeword is 12 symbols long (so that our criteria of at least four consecutive zero-value characters in the encoder shift register is met), then, the decoder (using the s erasure locations) will correct each of the "undecodable" remaining codewords in the block, notwithstanding each of them may have not only the predicted burst error of length 12 but, in addition thereto, as many as one or two erroneous symbols in other random locations in the codeword.

The latter is a likely scenario since, the one "decodable" codeword was characterized by a probability no greater than $2^{-24}$ of having errors in locations other than the burst error locations previously deduced in the manner described above. This being the case, it is almost virtually certain that the error rate was very low or zero in the same locations for all codewords in the block. Thus, one would expect only random errors of one or two characters at most in locations outside the predicted string of burst error locations for all codewords in the block.

The result is that the invention "untangles" and corrects a pattern of errors in an interleaved block of codewords which was not so easily susceptible of correction in the prior art.

DESCRIPTION OF THE DRAWINGS

The invention may be understood by reference to the accompanying drawings, of which:

FIG. 4 illustrates an exemplary error pattern received in the system of FIG. 3 which is easily corrected by the invention.

DETAILED DESCRIPTION

Conventional Error Trapping

Figure 1:
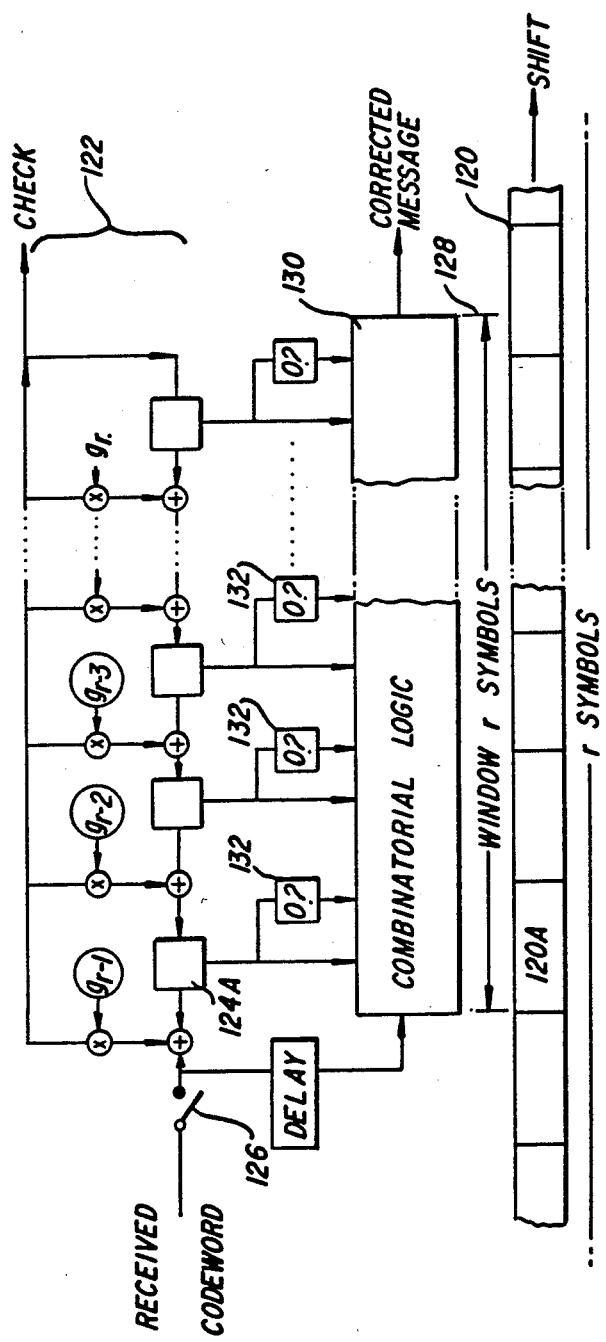
FIG. 1 is a block diagram of an error trapping decoder of the prior art.

Referring to FIG. 1, a received codeword 120 has n characters, of which 4 comprise redundant check characters computed from the remaining k characters (which are user data) in accordance with a code generator polynomial. The received codeword 120 is shifted through the 4 stages of a typical Reed-Solomon re-encoder 122, which has feedback provided in the well-known manner in accordance with the coefficients $g_0$, $g_1$, $g_2$, ..., $g_{r-1}$ of the code generator polynomial. After all n characters of the received codeword 120 have been shifted through the r stages of the re-encoder 122, the contents of each stage 124 of the re-encoder 122 contains a corresponding one of the r remainders of the received codeword 120. If there are no more than r/2 erroneous characters in the received codeword, and if all of the erroneous characters are within r locations of one another, then all of the errors may be corrected by conventional error trapping. In this process, a switch 126 is opened (to isolate the re-encoder 122) and the contents of the re-encoder are shifted right-to-left by one position. This may be thought of as a circularly shifting of the codeword through the encoder in the manner suggested in FIG. 2. With each such shift, the contents of the r stages 124 (FIG. 1) changes. Once the errors are all trapped, the stages 124 will contain all zeroes except for those locations corresponding to received errors in the codeword and comprise r "virtual check characters".

Each shift of the re-encoder 122 corresponds to a shift by one position of a window 128 of character length r which may be thought of as overlying the codeword 120. The codeword locations within the window 128 are called the virtual check locations, while the remaining codeword locations are called the virtual message locations. As soon as the window 128 simultaneously overlies all of the erroneous characters in the codeword 120, the contents of the r stages 124 (i.e., the virtual check characters) will be all zeroes, except for those corresponding to error locations in the codeword 120.

Combinatorial logic 130 simultaneously inspects, through r zero detectors 132, the contents of each of the stages 124 with each such shift. As soon as the zero detectors 132 indicate that all the errors have been trapped (i.e., all but no more than a limited number of the stages 124 contain all zeroes), the combinatorial logic adds all of the non-zero current contents of the stages 124 to the corresponding codeword locations within the current (shifted) position of the window 128 over the codeword 120. For example, if after several shifts of the re-encoder 122 the zero detectors 132 find that the contents of all of the r stages 124, except the first stage 124A, are zero, the combinatorial logic 130 adds the contents of the stage 124A to the received codeword character now at location 120A, the "first" location in the window 128. The result is the corrected codeword.

Limitations of Conventional Error Trapping

The problem, of course, is that it cannot be guaranteed that all continuous error bursts will be no greater than r/2 characters long, or that no two erroneous characters in a given received codeword will be more than r codeword locations apart (where r is the length of the encoder shift register). Thus, it cannot be guaranteed that plural errors in any received codeword can be trapped simultaneously in the re-encoder shift register. Error trapping cannot guarantee error correction of all erroneous characters in such cases.

The problem is how to use multiple error trapping in cases where the error burst length exceeds r/2 characters (when error trapping cannot guarantee error correction).

THE INVENTION

The power of the error trapping decoder of FIG. 1 is significantly enhanced by selecting a code, such as Reed-Solomon 255, characterized by a relatively large number (n) of symbols and by reducing the minimum required number of zero-value check characters from r/2 (required in the prior art) to some number significantly less than r/2. In the case of Reed-Solomon 255 code having 16 check characters, as long as there are at least four (i.e. r/4) zero-value virtual check characters generated in the encoder shift register after an optimum number of shifts thereof, the probability that one of these zero-value characters is a false indication is $2^{-24}$, which corresponds to an acceptable residual bit error rate at the decoder output for many applications.

Application To Interleaved Codes

Figure 3:
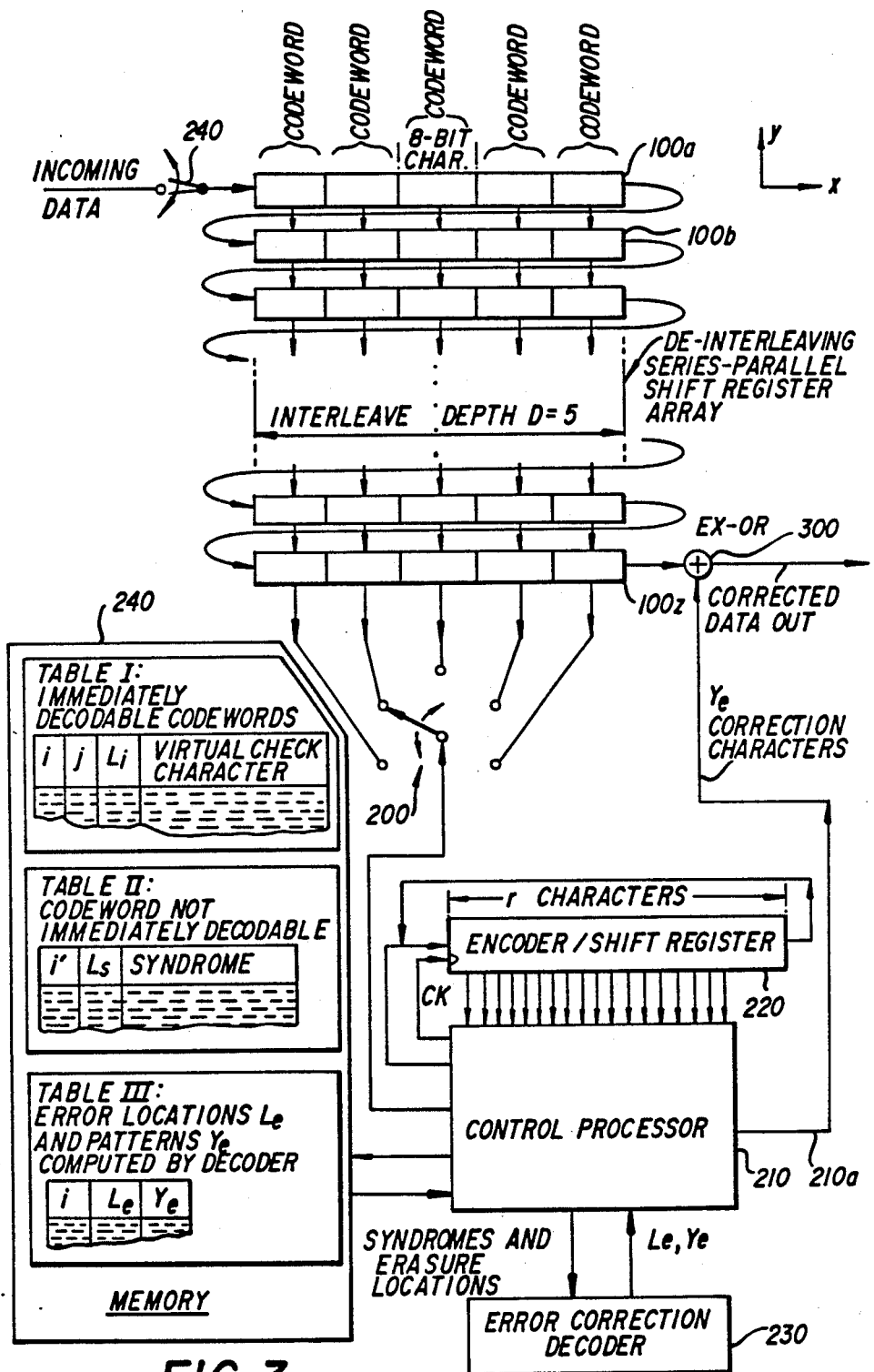
FIG. 3 is a block diagram illustrating the preferred embodiment of the invention.

The preferred embodiment of the invention is illustrated in FIG. 3. In the example of FIG. 3, data is transmitted through a channel in blocks of five interleaved codewords, each full-length RS255 having 255 characters including 16 check characters, each character comprising eight bits. In FIG. 3, incoming data received from the channel is de-interleaved using a de-interleaving series-parallel shift register array (of the well-known type) comprising 255 serial shift registers 100 arranged in parallel. Each shift register 100 stores and transfers five eight-bit characters 100 in serial fashion in the "X" direction indicated in FIG. 3. The 255 serial registers 100 further operate in the manner of five parallel registers, each of which stores and transfers 255 eight-bit characters in serial fashion in the "Y" direction in parallel with all of the other registers in the array.

As indicated in FIG. 3, the incoming interleaved data is transferred from left to right through the top shift register 100a in serial fashion, then routed to the left side of the next shift register 100b from whence it is again transferred from left to right, so as to serially snake its way through the entire array of registers 100 until it reaches the bottom register 100z.

Referring to FIG. 4, the array of registers 100 is just large enough to store precisely one block of five interleaved codewords, each codeword comprising 239 message characters and 16 check characters, each character comprising eight bits, each set of 239 message characters and 16 check characters comprising one codeword, each codeword being arranged in a vertical column in the Y direction. The 16 check characters of each codeword are located in the bottom 16 character locations of each vertical column of five codewords in the array, as indicated in FIG. 4.

The advantage of such interleaving, which is well-known in the art, is that interference in the channel causing a continuous burst of errors will "wipe out"

only a portion of each of the codewords in the block of FIG. 4, rather than completely wiping out one of them so as to leave no hope of correcting it. By dividing up an error burst among all five codewords in the block, one hopes that enough correct characters remain in each codeword to enable correction.

A switch 200 is provided having the ability to route any one of the five codewords stored in the array of registers 100 to a control processor 210. The control processor 210 is associated with an encoder shift register 220 of the type illustrated in FIG. 1 and previously described. The encoder shift register 220 includes means not illustrated in FIG. 3 (but which are illustrated in FIG. 1) for performing division by a chosen code generator polynomial of a sequence of characters shifted from left to right through the encoder shift register 220, as discussed previously in connection with FIG. 1. The control processor 210 controls the switch 200 so that it may shift any one of the five codewords stored in the array of registers 100 to the encoder shift register 220.

The control processor 210 is further connected to an error correction decoder 230 and a memory 240.

The control processor 210 begins error correction in accordance with the invention as follows. First, it allows the incoming interleaved block of codewords to be transferred in snakelike fashion through the array of registers 100 in the manner previously described until a complete block is stored in the array. Once this occurs, the array is isolated from the incoming data by means of a switch 240 responsive to the control processor 210. Next, the control processor 210 selects one codeword at a time from the array using the switch 200 and vertically shifts the corresponding vertical column of register locations in the Y direction so that the selected codeword passes through the switch 200 and is routed to the encoder shift register 220 so as to be shifted therethrough in accordance with the description previously given in connection with FIG. 1. Thus, the control processor 210 causes each of the five codewords stored in the de-interleaving array of registers 100 to be shifted vertically downward in the Y direction and through the encoder of register 220, one codeword at a time.

Algorithm of the Control Processor

The control processor 210 effects error correction of all five codewords in the block in accordance with the following operation:

1. For each of the codewords in the block, the control processor 210:
   a. shifts the codeword through the encoder of shift register 220 once so as to generate r (in this case r=16) remainder characters in the encoder shift register 220;
   b. isolates the encoder 220 (via the switch 200) and begins shifting the encoder shift register 220 in the manner described previously in connection with FIG. 1 until the longest possible string of consecutive zero-valued virtual check characters lie in the encoder shift register, and adds the corresponding non-zero virtual check characters to the characters in the corresponding codewords locations, so as to correct the codeword; but
   c. if it is not possible to produce a string of consecutive zero-valued virtual check characters of the minimum length (in this example, the minimum length of four characters) after shifting the encoder shift register 220 n (in this case n=255) times, the control processor 220 temporarily postpones processing this codeword and goes on to the next codeword in the block and repeats the process.

2. As long as a continuous string of the minimum length of zero-value virtual check characters is produced for at least the $i^{th}$ one of the five codewords in the block, the control processor 210 designates the corresponding non-zero-value virtual check locations in the $i^{th}$ codeword as erasure locations for the other codewords in the block for which it was not possible to generate a consecutive string of the minimum length of zero-valued virtual check characters.

3. The control processor 210 then corrects the remaining codewords in the block one at a time as follows:
   a. control processor 210 transmits the corresponding remainder previously computed in the encoder of shift register 220 to the error correction decoder 230; and
   b. the control processor 210 transmits to the decoder 230 the locations of the non-zero-value virtual check characters previously produced for the $i^{th}$ codeword in the block as erasure locations; and
   c. signals the error correction decoder 230 to generate in accordance with a standard error correction algorithm a set of correction characters $Y_e$ and corresponding error locations $L_e$. The processor 210 uses the locations $L_e$ to pinpoint erroneous characters in each codeword, and adds the corresponding error pattern $Y_e$ to the corresponding codeword character as it is shifted out of the array of registers 100 at an exclusive OR mod 2 adder 300.

Example of a Burst Error in an Interleaved Code

FIG. 4 illustrates a typical burst error situation which is not easily susceptible of error correction using prior art techniques.

In FIG. 4, the five codewords in the block, with the exception codeword #2, are not individually susceptible of error correction. Codeword #2, however, is susceptible of error correction and, upon the $j^{th}$ shift of the encoder shift register 220, produces a string of four zero-value virtual check characters therein.

In FIG. 4, for the sake of simplicity, it is assumed that all five of the codewords have been shifted circularly (in the manner of FIG. 2) by j codeword character positions, so that the last (bottom) character positions in each of the five vertical parallel registers (Y direction) correspond to 16 virtual check character locations shifted by j positions from the original codeword locations. The first 12 virtual check character locations in codeword #2 are non-zero, corresponding to an error burst of length 12 in codeword #2.

In accordance with the invention, it is highly likely that the error burst occurred through most if not all of the same codeword locations in all five codewords in the block. Accordingly, the control processor 210 designates the first 12 virtual check character locations (corresponding to j shifts of the "window" 128 of FIGS. 1 and 2) in all five codewords as erasure locations to the error correction decoder 230. Assuming that the code is a Reed-Solomon code, the decoder 230, armed with the 12 erasure locations thus deduced, can correct not only the 12 erasures but as many as two additional erroneous characters located in the other positions in each of the four remaining codewords (as discussed previously herein). Such randomly placed errors are illustrated in cross-hatching in FIG. 4.

The only requirement is that codeword #2 have an error pattern which is susceptible of error trapping in accordance with the invention. Specifically, if it is required, for the sake of reliability, that at least four consecutive zero-value virtual check characters be produced upon some optimum number of shifts of the encoder shift register, then codeword #2 must have no more than 12 erroneous characters in a burst, and further can have no other erroneous characters in random locations outside the burst locations.

Operation of the Control Processor

Figure 5A:
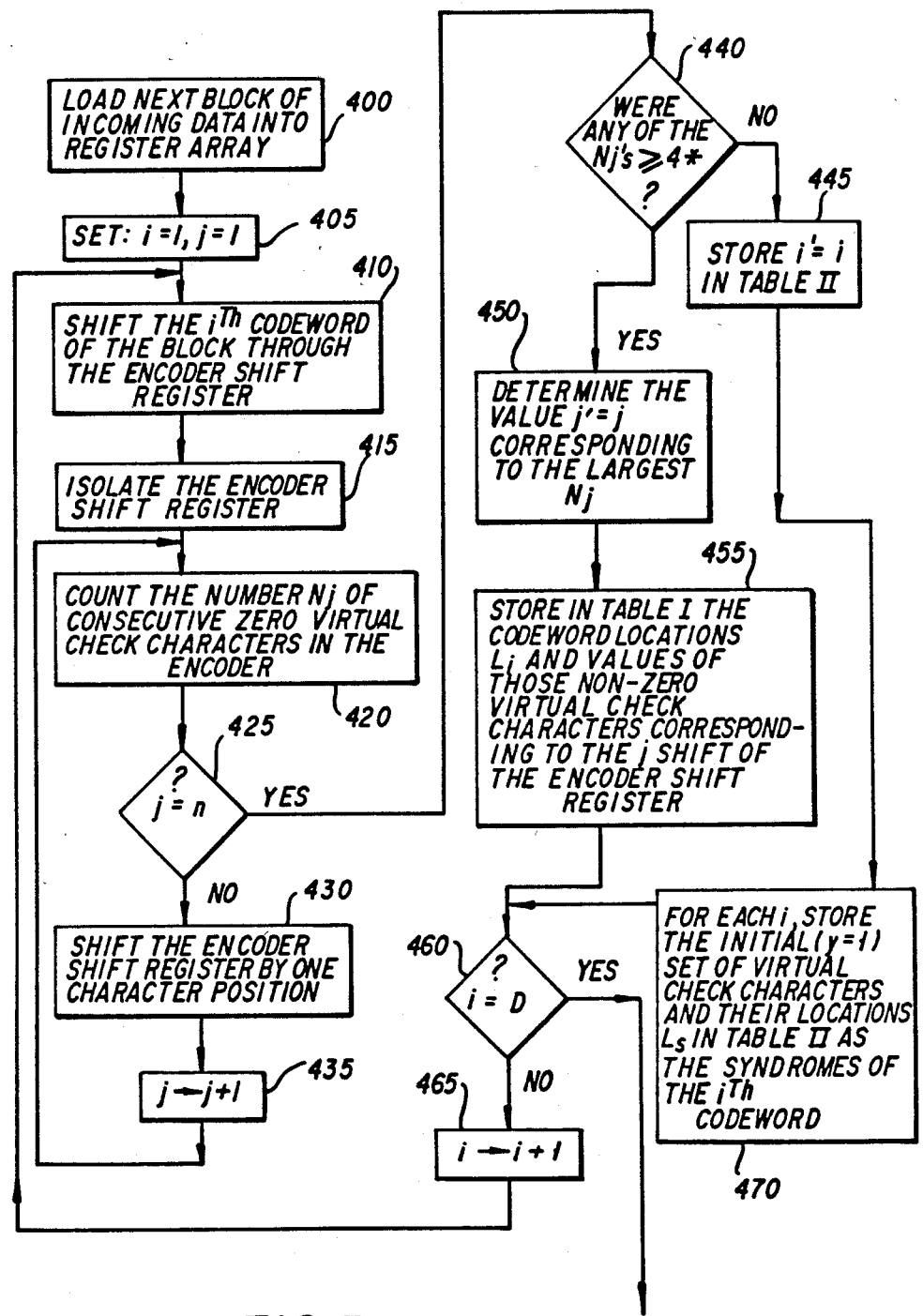
FIGS. 5a, 5b and 5c are flow diagrams illustrating the operation of the control processor in the system of FIG. 3.
Figure 5B:
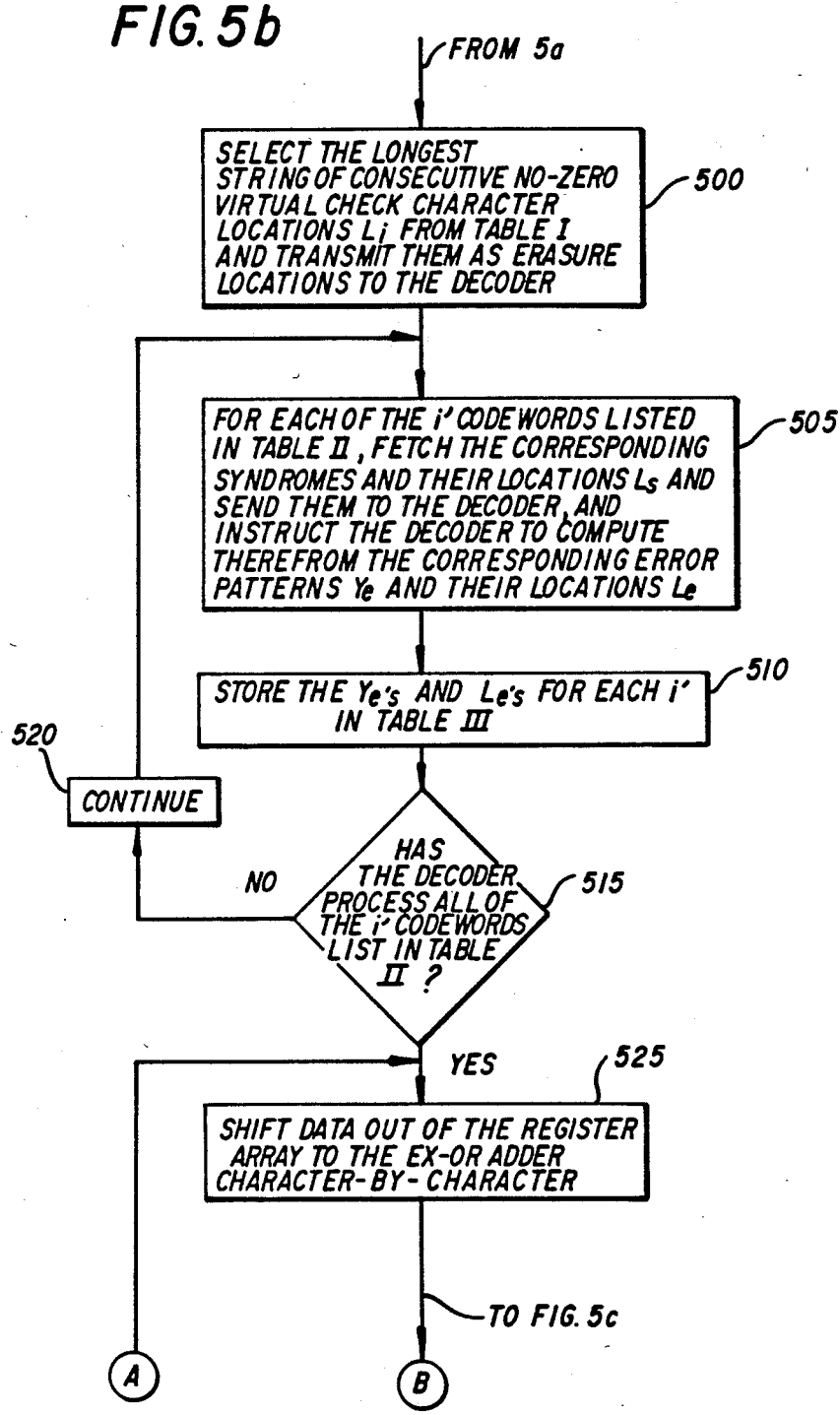
Figure 5C:
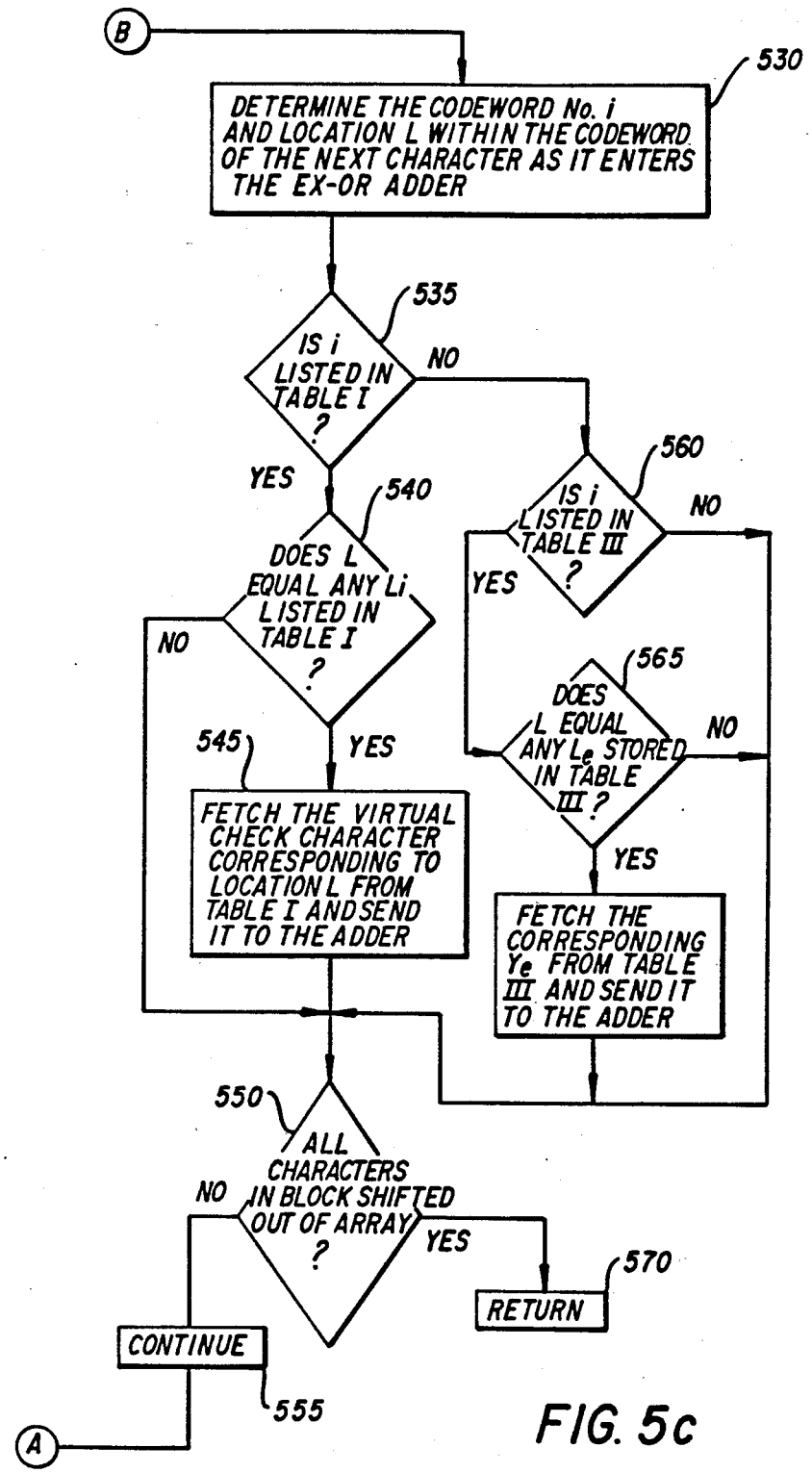

FIGS. 5a and 5b illustrate the operation of the processor 210 with the memory 240 in greater detail. Referring to FIG. 5a, the processor 210 causes a block of five codewords of the incoming data to be loaded in serial snake-like fashion into the array of registers 100 in the manner previously described. (Block 400.) Next, the processor sets two indexes, i and j, both equal to 1. (Block 405). As described in the legend in FIG. 5a, the index i specifies an individual one of the five codewords within the block and has a range of 1 through D, where D is the number of interleaved codewords per block, in this example, 5.

Next, the processor 210 causes the $i^{th}$ codeword to be shifted through the encoder shift register one time, and returns that codeword to its original location in the array of shift registers 100. (Block 410.) The processor 210 then isolates the encoder shift register 220. (Block 415.) Then, the processor 210 counts the number ($N_j$) of consecutive characters generated in the encoder shift register 220. $N_j$ stands for the number of consecutive zero characters generated in the encoder on the $j^{th}$ shift of the encoder, as set forth in the legend in FIG. 5a. Next, the processor 210 determines whether or not the number of encoder shift register shifts (j) is equal to the number n of symbols per codeword. (Block 425.) If not, the processor 210 causes the encoder shift register to be shifted by one character position (Block 430) and increments the index j by one (Block 435) and returns to block 420 to count the number of zero value characters present in the encoder shift register 220. This shifting and counting operation loop (boxes 420, 425, 430, 435) continues until as many as n shifts of the encoder shift register 220, all of the $N_j$'s being stored in the meantime. Once j reaches the value of n (number of characters per codeword which in this example *happens* to equal the number of characters in the code) the processor takes the YES branch from block 425 to block 440, at which point the processor 210 determines whether any of the $N_j$'s were greater than the minimum number of zero value virtual characters required by the user. As discussed previously, in connection with the example of RS 255 code, the minimum number of consecutive zero value virtual check characters may be chosen as 4 (or any other number less than r/2) to provide a maximum acceptable probability of a false indication, in this example $2^{-24}$.

If none of the $N_j$'s is greater than 4 (in other words if none of the n shifts of the encoder shift register produces a sufficiently long string of zero value virtual check characters—thus indicating that the $i^{th}$ codeword is "undecodable") then the encoder takes the NO branch of block 440 and stores the index of the current codeword, i, as an index i' of undecodable codewords in Table 2 of the memory 240. (Block 445.)

Figure 2:
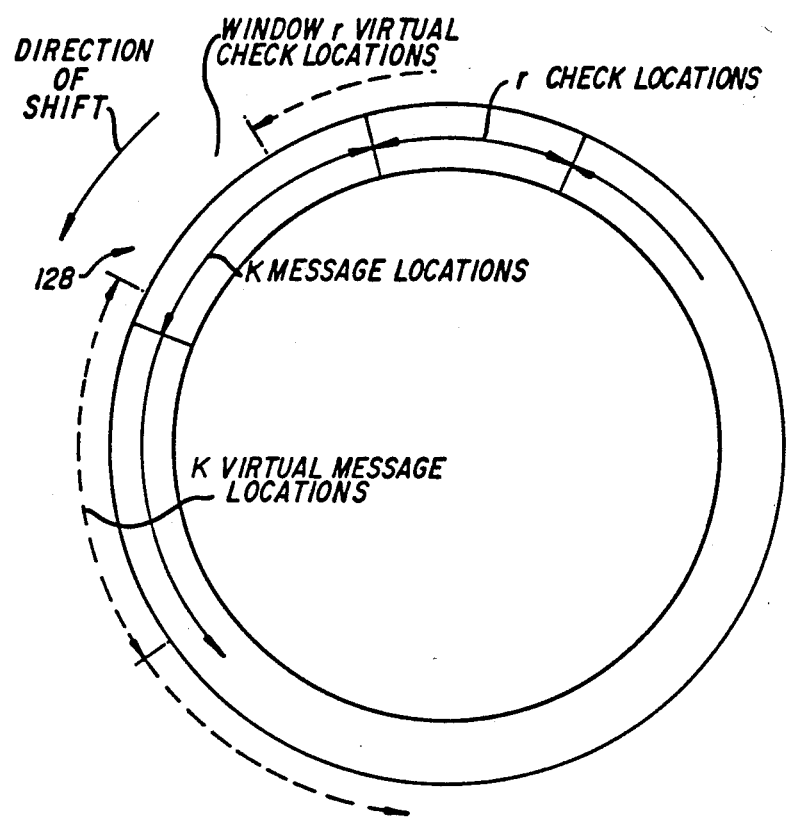
FIG. 2 is a diagram illustrating the principle of error trapping.

On the other hand, if at least one of the $N_j$'s was at least equal to the required number (4 in this example) then the processor 210 takes the YES branch of block 440 and determines which of the $N_j$'s for the $i^{th}$ codeword was the largest (block 450) and stores that value of j as an index j' in Table 1 of the memory 240. In addition, the processor 210 stores in Table 1 of the memory 240 the codeword locations $L_i$ and the values of those non-zero virtual check characters produced in the encoder shift register upon the j' shift of the encoder shift register 220. Referring to FIG. 2, the codeword locations $L_i$ of the non-zero virtual check characters may be computed from their position within the window 128 of virtual check locations by adding j to each location number within the window 128. Alternatively, one could simply keep track of the absolute codeword location of each symbol and as it is shifted through the encoder shift register 220. (Block 455 of FIG. 5a.)

The processor 210 then determines whether or not the codeword index i has reached the interleaving depth (number of codewords per block) D (in this example D=5). (Block 460.) If not, the processor 210 takes the NO branch of block 460, increments the codeword index i by 1 (block 465) and returns to block 410 to begin the entire process all over again for the next codeword. The process is repeated over and over until all codewords have been thus processed, at which point the codeword index i is equal to D in block 460. At this point, the processor 210 takes the YES branch of block 460 and proceeds to block 500 in FIG. 5b.

Returning to block 440, as mentioned previously, if no string of consecutive zero-value virtual check characters is produced upon any of the shifts of a codeword through the encoder shift register 220, (in other words if none of the $N_j$'s meets the minimum required number), then the processor 210 takes the NO branch of block 440 and stores the index i of that codeword as an index i' in Table 2 of the memory 240. (Block 445.) Then, for that value of i', the processor 210 stores the initial set of characters present in the encoder shift register (corresponding to the shift index j=1) as remainder characters, together with their locations $L_s$ in Table 2. (These remainder characters are used to correct errors in the $i'^{th}$ codeword in a later part of the process.) (Block 470.) The processor then goes to block 460, and continues in the manner described previously in connection with block 460. Thus, Table 2 constitutes a list of "undecodable" codewords in the block, and their remainders computed upon the first complete shift of each corresponding codeword through the encoder shift register 220.

Continuing now with block 500, the processor 210 has now stored sufficient information in the memory 240 to correct all codewords in the block, including the so-called "undecodable" codewords listed in Table 2. The decoder 210 proceeds as follows. First, the decoder 210 finds a string of consecutive non-zero virtual check character locations stored in Table 1 and transmits them as erasure locations to the decoder 230. In case there is more than one codeword as listed in Table 1 as being correctable by the error trapping techniques of the invention, the ambiguity can be resolved by simply selecting the longest string of consecutive non-zero virtual check character locations $L_i$ from Table 1. (Block 500.)

Then, for each of the codewords labeled by the index i' listed in Table 2, the processor 210 fetches the corresponding syndromes and their locations $L_s$ from Table 2 and sends them to the decoder 230 (one at a time). (Block 505.) The processor 210 instructs the decoder 230 to compute from the syndromes the corresponding error patterns $Y_e$ and their locations $L_e$ in the i'$^{th}$ codeword. (Block 505.) The decoder then causes the $Y_e$'s and the $L_e$'s just computed by the decoder 230 to be stored with the corresponding codeword index i' in Table 3. (Block 510.) Next the processor 210 determines whether the decoder 230 has processed all of the "undecodable" codewords (those designated by the index i') listed in Table 2. (Block 515.) If not, the processor 210 takes the NO branch of block 515 and continues the foregoing operation (block 520) and returns to the beginning of block 505 to fetch the remainders of the next codeword listed in Table 2, until all the codewords listed in Table 2 have been similarly processed through the loop of blocks 505, 510, 515 and 520. Then, the processor 210 takes the YES branch of block 515.

At this point, the processor 210 has computed all of the error patterns and their locations for all codewords in the block stored in the array of registers 100. The only remaining task to be performed by the processor 210 is to add each of the error patterns thus computed into the corresponding locations in the codewords in the block. For the (at least) one codeword which was susceptible of correction by error trapping (listed in Table 1) the decoder need merely add the non-zero virtual check locations to the corresponding codeword locations, while for the remaining codewords the processor must add the computed error patterns to the corresponding codeword locations. To do this, the processor 210 has a choice of either shifting out one codeword at a time from the array of registers 100 (by shifting them vertically "downward" in the Y direction as indicated in FIG. 3) and adding the corrections to the corresponding codeword locations as they exit the array of registers or, alternatively, shifting the block of codewords out of the array of registers in serial fashion, leaving the five codewords interleaved with one another, and adding the corrections to the corresponding codeword locations as they leave the array of registers 100, one character at a time. It is this latter alternative that is now described in connection with FIG. 5b.

Taking the YES branch of block 515, the processor 210 causes the array of registers 100 to shift the data out (in the snake-like fashion described previously) through an eight-bit exclusive OR gate or modulus-2 adder 300. (Block 525.) For each character that appears at one input of the adder 300, the processor 210 determines the codeword index number i and the location L of that character within the i$^{th}$ codeword. (Block 530.) The processor 210 then determines whether the codeword index i of the character currently at the input of the adder 300 is listed in Table 1. (Block 535.) If it is, then the processor takes the YES branch of block 535 and determines whether the location L of that character corresponds to any $L_i$ listed in Table 1. (Block 540.) If it does, then the processor 210 fetches the virtual check character corresponding to location L from Table 1 of the memory 240 and sends it to the other input of the adder 300. (Block 545.) If the location L of the current character in the adder 300 does not correspond to any $L_i$ list in Table 1, then that is an indication that character is correct so that no correction may be made, and the processor takes the NO branch of block 540. The processor 210 then determines whether all characters of all codewords in the entire block of codewords has been shifted out of the array of registers 100. (Block 550.) If not, the processor 210 continues the process (block 555) and returns to the beginning of block 525 to shift the next character out of the array of registers 100. Returning to block 535, when the processor 210 determines whether the codeword index i of the current character at the input to the adder 300 is listed in Table 1, the processor 210 may find that it is not so listed. In that case, the processor 210 takes the NO branch of block 535 and determines whether the codeword index i of the current character at the input to the adder 300 is listed in Table 3. (Block 560.) If it is so listed, then the processor 210 takes the YES branch of block 560 and determines whether the location of the current character at the input to the adder 300 corresponds to any error pattern location $L_e$ stored in Table 3. (Block 565.) If the processor determines that the codeword location L of the current character at the input to the adder 300 does correspond to an $L_e$ stored in Table 3, then the processor takes the YES branch of block 565 and fetches the corresponding error pattern $Y_e$ from Table 3 and sends it to the other input of the adder 300.

Returning to block 560, if the processor determines that the codeword index i of the current character at the input to the adder 300 is not one of the codewords listed in Table 3, then the processor 210 takes the NO branch of block 560 and goes to the beginning of block 550. Similarly, at block 565, if the processor 210 determines that the codeword location L of the current character at the input to the adder 300 does not correspond to any $L_e$ stored in Table 3, the processor 210 takes the NO branch of block 565 and goes to the beginning of block 550.

As mentioned previously, the entire process continues until all characters of all codewords in the block of five codewords have been shifted out of the array of registers 100 and through the adder 300. At this point, the processor 210 takes the YES branch of block 550 and returns (block 570) to block 400 of FIG. 5a, enabling the next block of five interleaved codewords to be loaded into the array of registers 100.

In the foregoing description, the corrected data exits the adder 300 in interleaved form. If, on the other hand, it is desired to have de-interleaved data in corrected form, then the foregoing process illustrated in FIG. 5b could be performed internally within the control processor 210, each codeword being corrected individually as it is shifted downward in the Y direction in FIG. 3 through the control processor 210, the correction being performed on a codeword-by-codeword basis, and the adder 300 would simply be eliminated. The de-interleaved corrected data, in such a case, would be output at the control processor output 210a.

While the invention has been described in detail by reference to preferred embodiments thereof, it is understood that variations and modifications may be made without departing from the spirit and scope of the invention.

What is claimed is:

1. An error correction processor for interleaved codes comprising:
    storage means for receiving and storing a block of D interleaved codewords, each codeword being of length n characters including r check characters in a code of size N characters;
    encoder means for computing from a given codeword a set of r remainder characters with respect to a chosen set of characters defining a code generator polynomial, said encoder means comprising encoder shift register means for receiving successive characters of said given codeword and for storing said r remainder characters, and r zero detector means for detecting whenever corresponding ones of characters stored in said encoder shift registers are zero value;

a decoder processor adapted to execute an error correction algorithm so as to generate from said set of remainder characters a set of error patterns and corresponding error locations in said given codeword; and control processor means for:
 a. activating said encoder shift register means so as to shift each one of said D codewords in said received block individually from said storage means through said encoder means so that said encoder means generates a set of r remainder characters in said encoder shift register means corresponding to said one codeword,
 b. isolating said encoder means and causing said encoder means to shift its contents by one character location as many as n times so as to produce as many as n sets of r virtual check characters,
 c. sensing said r zero detector means and, whenever said r zero detector means detects in said encoder shift register means a continuous succession of zero-value virtual check characters in excess of a threshold number of zero-value virtual check characters, transmitting to said decoder processor the locations of the corresponding non-zero-value virtual check characters as erasure locations in all other codewords in said received block, whereby said decoder corrects said other codewords in said block from the corresponding remainder characters using said erasure locations, while said control processor means corrects said one codeword by adding said set of virtual check characters corresponding to said one shift to corresponding locations in said one codeword.

2. The error correction processor of claim 1 wherein said threshold number of continuous zero-value check characters and said code size N are chosen to correspond to a maximum probability that one or more of said zero-value virtual check characters is a false indication, said threshold number being selected so that said probability is acceptably low.

3. The error correction processor of claim 1 wherein said codewords and said code generator polynomial correspond to a Reed-Solomon code, whereby said decoder corrects as many as s erasures having designated locations and t errors of a priori unknown locations in each of said other codewords with the proviso that $s+2t$ is no greater than r.

4. The error correction processor of claim 1 wherein said erasure locations correspond to a continuous error burst affecting the same character locations in all codewords in said block.

5. An error correction processor employing a code of size N, comprising:
 encoder means for computing from a given codeword of length n characters including r check characters a set of r remainder characters with respect to a chosen set of characters defining a code generator polynomial, said encoder means comprising encoder shift register means for receiving successive characters of said given codeword and for storing said r remainder characters, and r zero detector means for detecting whenever corresponding ones of characters stored in said encoder shift registers are zero value, said encoder means further comprising r adder means for adding corresponding ones of said characters stored in said encoder shift register means to individual characters in said codeword; and control processor means for:
 a. activating said encoder shift register means so as to shift the contents of said encoder means as many as n times so as to produce as many as n sets of r virtual check characters in said encoder shift register means,
 b. sensing said r zero detector means and, whenever said r zero detector means detects in said encoder shift register means a succession of zero-value virtual check characters in excess of a threshold number B of continuous zero-value virtual check characters, enabling said r adder means so as to add the non-zero-value virtual check characters produced upon said one shift of said encoder to corresponding locations in said given codeword, so as to correct said codeword, wherein said threshold B of non-zero-value check characters corresponds to a probability $(N+1)^{-(B-1)}$ that one or more of said zero-value check characters is a false indication, and wherein said probability corresponds to an acceptably low residual bit error rate.

6. The error correction processor of claim 5 wherein $N=255$, $r=16$, $B=4$ and said probability is $2^{-24}$.

7. An error correction processor for interleaved codes comprising:
 storage means for receiving and storing a block of D interleaved codewords, each codeword being of length n characters including r check characters;
 encoder means for computing from a given codeword a set of r remainder characters with respect to a chosen set of characters defining a code generator polynomial, said encoder means comprising encoder shift register means for receiving successive characters of said given codeword and for storing said r remainder characters, and r zero detector means for detecting whenever corresponding ones of characters stored in said encoder shift registers are zero value, said encoder means further comprising r adder means for adding corresponding ones of said characters stored in said encoder shift register means to individual characters in said codeword;

a decoder processor adapted to execute an error correction algorithm so as to generate from said set of remainder characters a set of error patterns and corresponding error locations in said given codeword; and control processor means for:
 a. activating said encoder shift register means so as to shift each one of said D codewords in said received block individually from said storage means through said encoder means so that said encoder means generates a set of r remainder characters in said encoder shift register means corresponding to said one codeword,
 b. isolating said encoder means and causing said encoder means to shift its contents by one character location as many as n times so as to produce as many as n sets of r virtual check characters, c. sensing said r zero detectors and determining from said r zero detectors which one of said shifts of said encoder means produces the longest continuous succession of zero-value virtual check characters in excess of a threshold number of zero-value check characters, and transmitting to said decoder processor the locations of the corresponding non-zero-value virtual check characters as erasure locations in all other codewords in said received block, whereby said decoder corrects said other codewords in said block from the corresponding remainder characters using said erasure locations, while enabling said r adder means whereby to correct said one codeword by adding said set of virtual check characters corresponding to said one shift to corresponding locations in said one codeword.

8. The error correction processor of claim 7 wherein said threshold number of continuous zero-value check characters and said code size N are chosen to correspond to a maximum probability that one or more of said zero-value virtual check characters is a false indication, said threshold number being selected so that said probability is acceptably low.

9. The error correction processor of claim 7 wherein said codewords and said code generator polynomial correspond to a Reed-Solomon code, whereby said decoder corrects as many as s erasures having designated locations and t errors of *a priori* unknown locations in each of said other codewords with the proviso that $s+2t$ is no greater than r.

10. The error correction processor of claim 7 wherein said erasure locations correspond to a continuous error burst affecting the same character locations in all codewords in said block.

* * * * *